United States Patent [19]
Ouhata et al.

[11] Patent Number: 5,246,741
[45] Date of Patent: Sep. 21, 1993

[54] METHOD FOR SURFACE MODIFICATION AND APPARATUS THEREFOR

[75] Inventors: Koukichi Ouhata; Kenichi Natsui, both of Hitachi, Japan

[73] Assignee: Hitachi, Ltd., Tokyo, Japan

[21] Appl. No.: 630,858

[22] Filed: Dec. 20, 1990

[30] Foreign Application Priority Data

Dec. 22, 1989 [JP] Japan ................... 1-331328

[51] Int. Cl.$^5$ .................. B05D 3/06; C23C 14/48
[52] U.S. Cl. .................... 427/524; 427/530;
427/529; 204/192.11; 204/192.15; 204/192.34;
204/192.35; 204/192.16
[58] Field of Search .............. 427/38, 39, 42, 524,
427/529, 530; 204/192.1, 192.11, 192.34,
192.35, 192.15, 192.16, 192.32

[56] References Cited

U.S. PATENT DOCUMENTS

| | | | |
|---|---|---|---|
| 3,192,892 | 7/1965 | Hanson et al. | 427/38 |
| 3,600,218 | 8/1971 | Pennebaker | 427/38 |
| 3,900,636 | 8/1975 | Curry et al. | 427/38 |
| 3,915,757 | 10/1975 | Engel | 427/38 |
| 4,072,768 | 2/1978 | Fraser et al. | 427/38 |
| 4,250,832 | 2/1981 | Ozaki | 427/38 |
| 4,356,210 | 10/1982 | Imai et al. | 427/38 |
| 4,382,100 | 5/1983 | Holland | 427/38 |
| 4,465,337 | 8/1984 | Baron et al. | 427/38 |
| 4,560,576 | 12/1985 | Lewis et al. | 427/38 |
| 4,618,592 | 10/1986 | Kuramoto et al. | 501/96 |
| 4,622,236 | 11/1986 | Morimoto et al. | 427/38 |
| 4,657,774 | 4/1987 | Satou et al. | 427/38 |
| 4,725,345 | 2/1988 | Sakamoto et al. | 427/38 |
| 4,847,221 | 7/1989 | Horiguchi et al. | 501/96 |
| 4,917,953 | 4/1990 | Hioki et al. | 427/38 |
| 4,975,260 | 12/1990 | Imai et al. | 423/412 |
| 4,983,553 | 1/1991 | Dunn et al. | 501/96 |

FOREIGN PATENT DOCUMENTS 60-60910 4/1985 Japan.

*Primary Examiner*—Marianne Padgett
*Attorney, Agent, or Firm*—Antonelli, Terry, Stout & Kraus

[57] ABSTRACT

A substrate to be modified is placed in a vacuum vessel, a reducing atmosphere is provided over the substrate and simultaneously therewith the substrate is irradiated with accelerated ions, whereby oxygen which bonds to the substrate is freed from the substrate, the oxygen bonds to a material which forms the reducing atmosphere and the surface of the substrate is modified by the accelerated ion. The surface of the substrate can be thus efficiently modifed at relatively low temperatures. Furthermore, by evaporating carbon for an alumina substrate or alumina powder or providing hydrocarbon gas over the alumina substrate or alumina powder in a vacuum vessel, the alumina substrate or alumina powder is providing in the reducing atmosphere and the alumina substrate or alumina powder is irradiated with accelerated nitrogen ions from an ion source, whereby aluminum and oxygen which constitute the alumina substrate or alumina powder are cut off from each other by irradiation with the accelerated nitrogen ions. The oxygen reacts with carbon or hydrocarbon gas which forms the reducing atmosphere to form carbon monoxide or carbon dioxide, which is evacuated. On the other hand, the aluminum is modified to aluminum nitride by the accelerated nitrogen ions or nitrogen particles. That is, the surface of the alumina substrate or alumina powder can be efficiently modifed at relatively low temperatures.

8 Claims, 10 Drawing Sheets

F I G. 1
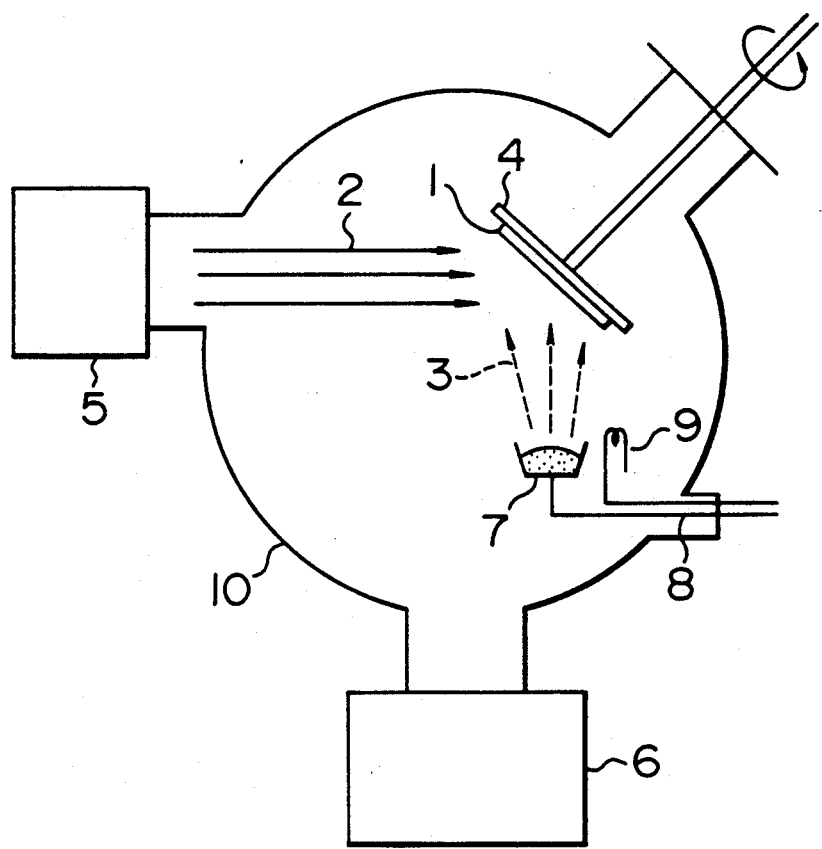

BOND ENERGY B.E. (eV)

METHOD FOR SURFACE MODIFICATION AND APPARATUS THEREFOR

BACKGROUND OF THE INVENTION

The present invention relates to a method for modification of properties of substrates by irradiating substrates to be modified with accelerated ions, and an apparatus used therefore.

The following methods have been known as conventional surface modification methods, especially for modification of the surface of aluminum or alumina to produce aluminum nitride.

For example, Japanese Patent Kokai No. 60-60910 discloses a method for producing aluminum nitride which comprises treating a mixture of alumina powder and carbon powder at a very high temperature of 1400°-1700° C. for a long time of 3-10 hours in a nitrogen or ammonia atmosphere. This method utilizes a thermal equilibrium reaction at high temperature and this is a general method in conventional surface modification. However, this method requires a large plant investment besides a large maintenance cost. In addition, workability is low and, thus, this method is unsatisfactory in practical application.

Furthermore, Japanese Patent Kokai No. 62-128989 discloses a method which comprises subjecting a sintered alumina plate to low-temperature plasma treatment in an atmosphere of nitrogen-hydrogen mixed gas to form an aluminum nitride thin film on the surface of the sintered alumina plate. According to this method, although aluminum nitride film is formed on the substrate surface in a relatively short time of 1 hour, the film is formed in the mixed gas atmosphere under a very high pressure of 10 Torr after evacuation of the chamber until the pressure in the chamber reaches 0.01 Torr and hence many impurities are contained. Furthermore, the temperature for plasma treatment is as low as 800°-950° C. Thus, this method also has problems in practical use.

Other methods for production of aluminum nitride are formation of aluminum nitride on the surface of metallic aluminum by plasma jetting or arcing. However, these methods require a high temperature and a high pressure and have problems in practical use like the above-mentioned methods.

Furthermore, as methods for modification of the surface of metallic or non-metallic materials, especially at a relatively low temperature of from room temperature to a few hundred ° C., there have been known an ion plating method and a dynamic mixing method which comprises simultaneously carrying out ion irradiation and vapor deposition. The ion plating method comprises ionizing metal vapor and depositing it on a material and the dynamic mixing method comprises simultaneously carrying out vapor deposition of metal vapor on a material and ion implantation. These methods both carry out coating on the surface of materials to be treated and do not modify the materials by changing the properties of the materials.

As explained above, the conventional methods utilize thermal equilibrium reaction or plasma and require a considerably high temperature for the treatment and do not give any consideration to plant investment, maintenance cost, operating facility, and treatment of materials combined with materials of relatively low melting point Thus, these methods have problems for practical applications.

Moreover, according to the latter conventional methods, a treatment at a relatively low temperature is possible utilizing ionization and ion irradiation, but basically these methods merely carry out coating of the surface of materials and do not give any consideration to modification of materials in a real sense.

SUMMARY OF THE INVENTION

A first object of the present invention is to provide a method by which surfaces of substrates can be efficiently modified at a relatively low temperature and an apparatus used therefor.

A second object of the present invention is to provide a method by which surfaces of alumina substrates and alumina powders can be efficiently modified at a relatively low temperature.

According to the present invention, the first object can be attained by a method which comprises subjecting a substrate to be modified, present in a vacuum vessel, to irradiation with accelerated ions while providing a reducing atmosphere for the substrate, and by an apparatus which is provided with a vacuum vessel, a substrate holding device for holding in the vacuum vessel a substrate to be modified, a means for providing a reducing atmosphere for the substrate held by the holding device, and an ion source for irradiating the substrate with accelerated ions.

The object can further be attained by an apparatus which is provided with a vacuum vessel, a member comprising a material capable of providing a reducing atmosphere in the vacuum vessel, while placing a substrate on the member, and an ion source for irradiating the member and the substrate placed on the member with accelerated ions.

The second object can be attained by a method which comprises subjecting the surface of an alumina substrate or alumina powder to irradiation with accelerated nitrogen ions while providing a reducing atmosphere for the alumina substrate or alumina powder by evaporation of carbon by vacuum evaporation method or by blowing a hydrocarbon gas onto the alumina substrate or alumina powder, and by an apparatus which is provided with a vacuum vessel, a group of trays which are endlessly connected in the vacuum vessel and comprise a material containing a carbon component, a means for circulating the group of trays, a means for leading the alumina powder to be modified to said trays, an ion source for irradiating the alumina powder on the trays with nitrogen ions, and a means for feeding the thus irradiated alumina powder to said means for leading the alumina powder to the trays. That is, when a substrate to be modified is placed in a vacuum vessel and irradiated with accelerated ions while placing the substrate in a reducing atmosphere, the substrate and oxygen bonded to the substrate are cut off from each other by the irradiation with ions, and the oxygen cut off from the substrate bonds to the substance forming the reducing atmosphere and is evacuated and, on the other hand, the surface of the substrate from which oxygen has been cut off is modified by the accelerated ions. In this way, the substrate can be efficiently modified at a relatively low temperature.

Furthermore, the alumina substrate or alumina powder in the vacuum vessel is allowed to be present in a reducing atmosphere by evaporating carbon or blowing a hydrocarbon gas onto the alumina substrate or alumina powder. The alumina substrate or alumina powder in the reducing atmosphere is irradiated with accelerated nitrogen ions from an ion source. Thereby, aluminum and oxygen which constitute the alumina substrate or alumina powder are cut off from each other by irradiation with the accelerated nitrogen ions. The oxygen which has been cut off reacts with carbon or hydrocarbon gas constituting the reducing atmosphere to produce carbon monoxide or carbon dioxide, which is evacuated. On the other hand, the aluminum from which oxygen has been cut off is modified to aluminum nitride by accelerated nitrogen ions or nitrogen particles emitted from the ion source. That is, the surface of the alumina substrate or alumina powder can be efficiently modified at a relatively low temperature.

BRIEF DESCRIPTION OF THE DRAWINGS

FIG. 1 schematically shows one example of surface modifying apparatus of the present invention.

DESCRIPTION OF THE PREFERRED EMBODIMENTS

The present invention will be outlined below in comparison with a conventional technique prior to explaining examples of the present invention.

Coating of the surface of substrate which is a conventional method is shown in the following formula (1).

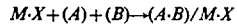

In the above formula, (A) is an ion beam, (B) is vapor or an atmospheric gas and M·X is a substrate of oxide which has no relation with the product.

FIG. 2 schematically shows the above formula (1) where (a) shows the state before the treatment and (b) shows the state after the treatment.

Figure 2A:
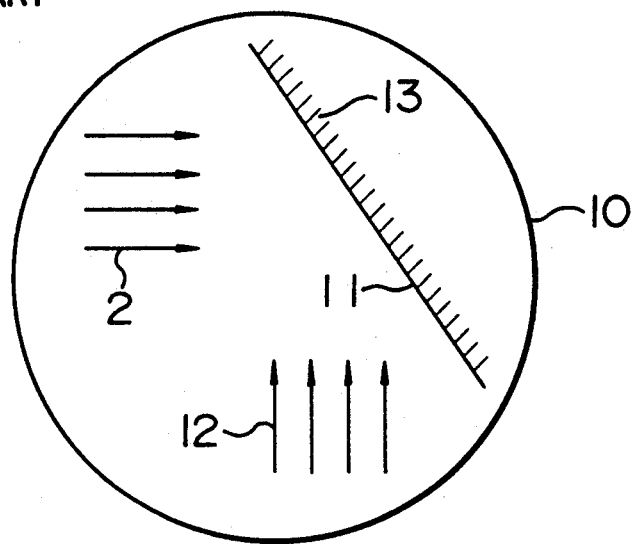
FIG. 2 explains coating treatment of the surface of a substrate according to a conventional method, wherein (a) shows the state before the treatment and (b) shows the state after the treatment.
Figure 2B:
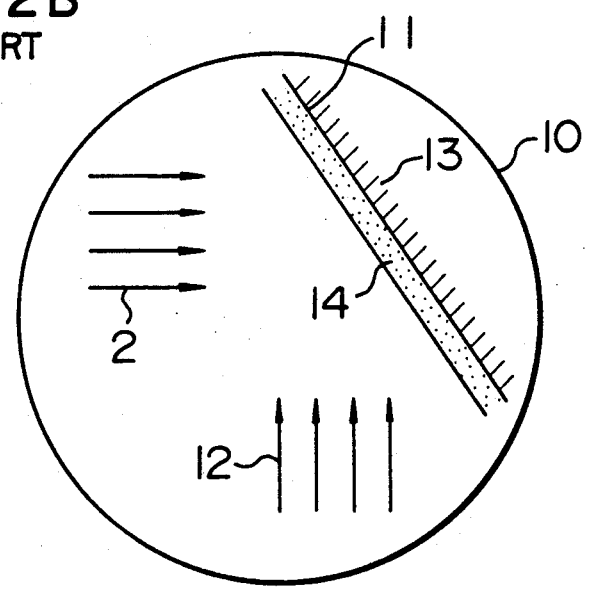

That is, according to the conventional dynamic mixing method, as shown in FIG. 2(a), vacuum deposition of vapor or atmospheric gas 12 (for example, (B) is Ti vapor) on surface 11 of substrate 13 (for example, M·X is Fe, Cu, Al or $Al_2O_3$) takes place simultaneously with implantation with ions 2 (for example, (A) is N ions), whereby mixed layer 14 (for example, TiN) of ion beam (A) (for example, N ion) and vapor or atmospheric gas (for example, Ti vapor) is coated on surface 11 of substrate 13 as shown in FIG. 2(b).

On the other hand, modification of a property of the surface or the whole of substrate according to the present invention is shown in the following formula (2).

$$M·X+(A)+(C)\rightarrow M·A+C·X\uparrow \qquad (2)$$

In the above formula, (A) and M·X are the same as in formula (1) and (C) indicates reducing vapor or reducing atmosphere gas, which reduces an oxide substrate (M·X) to modify the surface of the substrate to a compound of M and A (C·X is evacuated).

FIG. 3 schematically shows the above formula (2) where (a) shows the state before modification and (b) shows the state after modification.

Figure 3A:
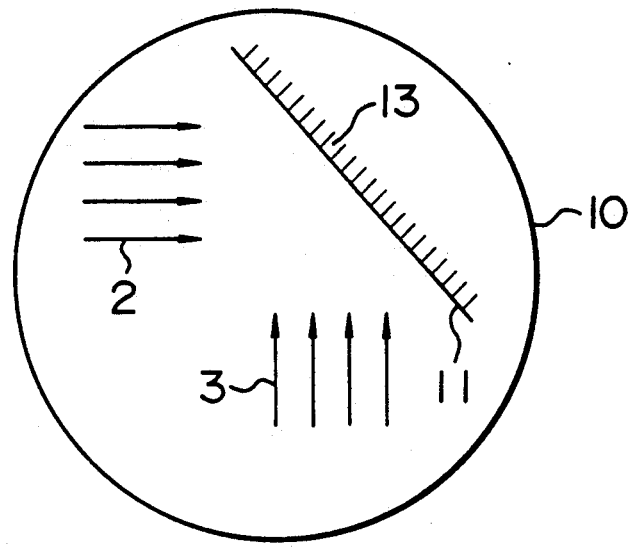
FIG. 3 explains modification of a substrate according to the present invention, wherein (a) shows the state before modification and (b) shows the state after modification.
Figure 3B:
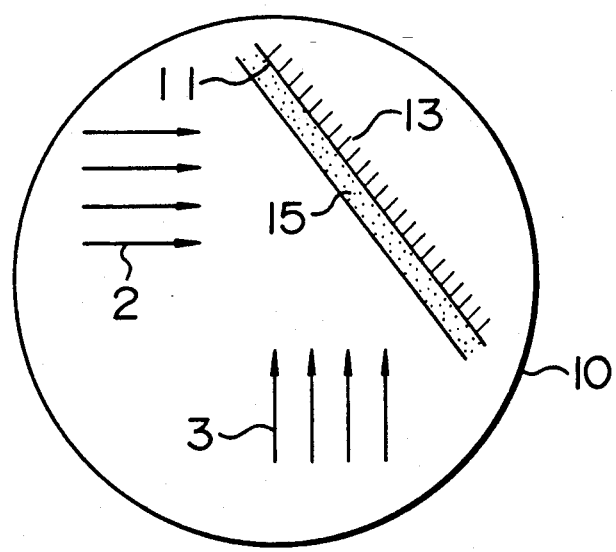

That is, according to the dynamic mixing method of the present invention, as shown in FIG. 3(a), a reducing vapor or reducing atmospheric gas 3 (for example, (c) is C vapor) is blown onto surface 11 of oxide substrate 13 (for example, M·X is $Al_2O_3$) to provide a reducing atmosphere of reduced pressure and the oxide substrate 13 placed in the atmosphere is irradiated with accelerated ions 2 (for example, (A) is N ions), whereby surface 11 of oxide substrate 13 is modified to a compound (aluminum nitride) 15 of N ions (A) and Al (M) as shown in FIG. 3(b).

One example of the present invention will be explained in detail referring to the drawings.

FIG. 1 shows one example of an apparatus for surface modification of the present invention. In FIG. 1, 10 indicates a vacuum vessel in which are placed alumina substrate 1 held by freely rotatable holding device 4, crucible 7 which constitutes vacuum evaporation device 8 which provides a reducing atmosphere for the alumina substrate 1, and electron source 9. Furthermore, vacuum vessel 10 is provided with ion source 5 which irradiates alumina substrate 1 with nitrogen ions 2 and vacuum pump 6 for drawing vacuum vessel 10 to a desired degree of vacuum.

Next, operation of the apparatus will be explained.

First, alumina substrate 1 of 50 mm×50 mm× 1 mm thick is irradiated with nitrogen ion beam 2 of 50 mA (0.6 mA/cm²) accelerated at 10 kV from ion source 5 to sputter impurites covering the surface of alumina substrate 1 for cleaning. Then, carbon vapor 3 is blown onto the substrate at a vapor deposition rate of several Å/s to several ten Å/s by vacuum evaporation device 8 and simultaneously the substrate is irradiated with the above-mentioned nitrogen ion beam 2. By blowing carbon vapor 3 onto alumina substrate 1, the bond between aluminum and oxygen which constitute the alumina is cut off and the oxygen combines with carbon vapor 3 and is evacuated as carbon monoxide or carbon dioxide.

On the other hand, aluminum of the surface portion of alumina substrate 1 from which oxygen has been cut off reacts with nitrogen ions upon irradiation with nitrogen ion beam 2 and is modified to aluminum nitride. The degree of vacuum in vacuum vessel 10 is previously enhanced to $2 \times 10^{-6}$ Torr and is kept at $1 \times 10^{-4}$ Torr during the surface modification.

Moreover, irradiation of alumina substrate 1 with nitrogen ions 2 causes elevation in temperature of alumina substrate 1. In order to keep the alumina substrate 1 at a relatively low temperature, it is necessary to hold the alumina substrate 1 by holder 4 equipped with a cooling means or to carry out the irradiation with nitrogen ion beam 2 intermittently.

In the apparatus of the above example, carbon vapor 3 is blown by vacuum evaporation device 8, but this carbon vapor 3 may be injected from outside of vacuum pump 6.

Irradiation with nitrogen ion 2 causes charge-up of the surface of alumina substrate 1, but it is needless to say that this can be inhibited by application of an electron shower by providing electron source 9.

Figure 4A:
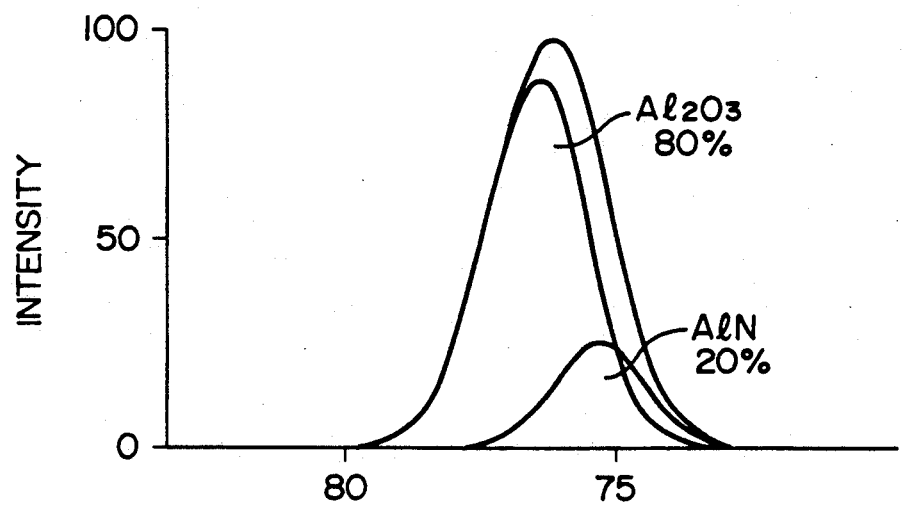
FIG. 4 shows relations between intensity and bond energy as a result of analysis of the surface of alumina substrate modified by the present invention by X-ray photoelectron spectroscopy, wherein (a), (b), and (c) are characteristic curves of the results when vacuum evaporation rates of carbon were 2 Å/s, 4 Å/s and 10 Å/s, respectively.
Figure 4B:
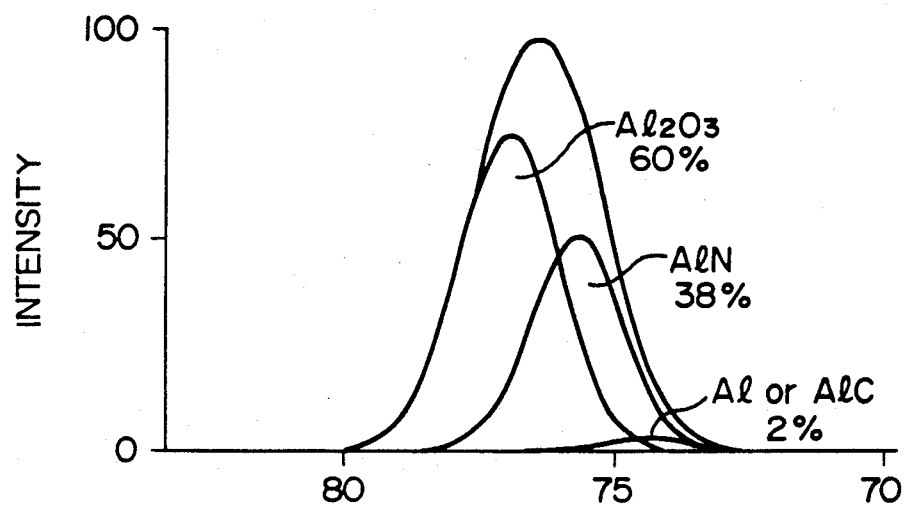
Figure 4C:
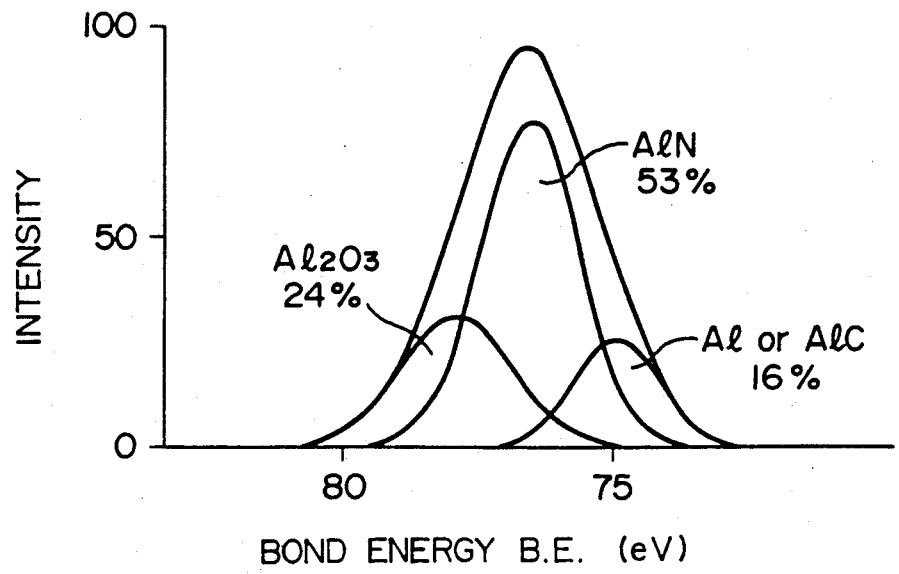

FIG. 4 shows results of analysis by X-ray photoelectron spectroscopy (XPS) when the surface of an alumina substrate was modified to aluminum nitride using the apparatus of FIG. 1 which is one example of the present invention, wherein the abscissa axis indicates a bond energy and the ordinate axis indicates an intensity. FIG. 4(a), (b) and (c) show the peaks corresponding to spectra of AlN, $Al_2O_3$, Al and AlC when surface modification was carried out changing the vacuum evaporation rate to 2 Å/s, 4 Å/s, and 10 Å/s, respectively. From these results, it can be seen that a surface layer comprising mixture of AlN, $Al_2O_3$, AlC or Al was formed in the surface portion of the alumina substrate although the proportion of the components varies depending on conditions of the surface modification treatment.

Figure 5:
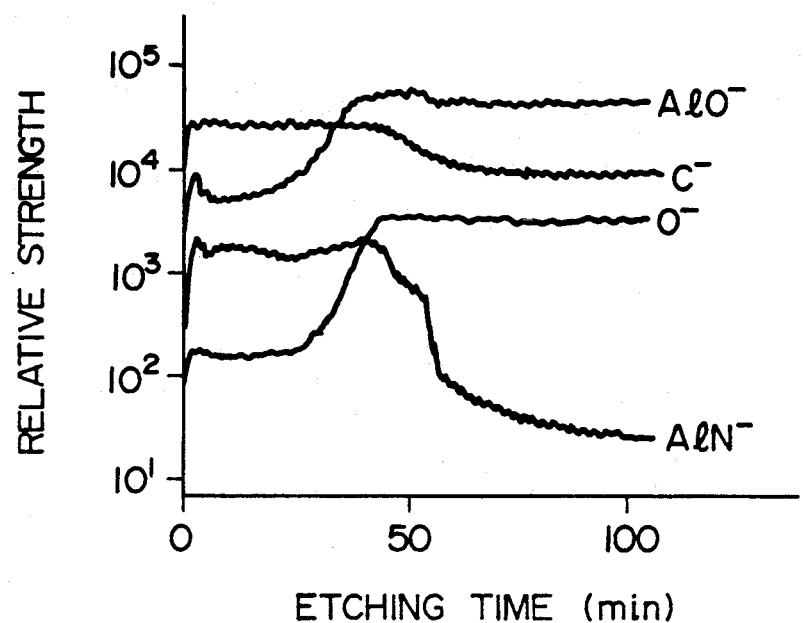
FIG. 5 shows characteristic curves which show concentration distribution of the surface of the alumina substrate modified by the present invention in terms of relation between relative strength and etching time.

FIG. 5 shows results of analysis on concentration distributions of $AlN^-$, $AlO^-$, and the like in the depth direction of a section of substrate when the surface of the substrate was modified to aluminum nitride, wherein the abscissa axis indicates an etching time and the ordinate axis indicates a relative strength. The results show that, for example, the surface layer of the alumina substrate was modified to AlN to the depth corresponding to 40-50 minutes in etching time.

Figure 6:
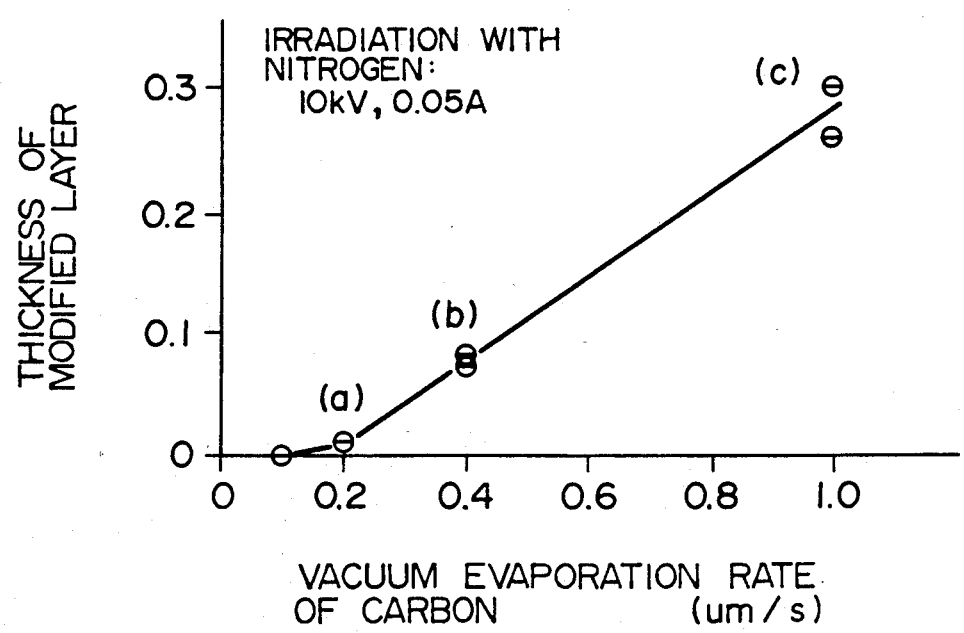
FIG. 6 is a graph which shows thickness of modified layer of the alumina substrate modified by the present invention in respect to vacuum evaporation rate of carbon changed corresponding to (a), (b) and (c) of FIG. 4.

FIG. 6 shows thickness of layer of an alumina substrate modified to aluminum nitride for respective evaporation conditions of carbon corresponding to FIG. 4 (a)-(c).

When a ratio of the number of particles of nitrogen and carbon which reach the surface of alumina substrate (N/C) is obtained based on the irradiation condition of nitrogen ion, the evaporation condition of carbon and properties such as Avogadro's constant, specific gravity and atomic weight, N/C is 333, 167, 83, 33 and 1 when the vacuum evaporation rate of carbon is 1 Å/s, 2 Å/s, 4 Å/s, 10 Å/s and 330 Å/s, respectively.

From the above results, it can be seen that the surface of alumina substrate is modified to aluminum nitride by exposing the alumina substrate to carbon vapor and simultaneously irradiating the alumina substrate with nitrogen ions. It can also be seen that when N/C is high, only thin layer is modified, while with increase of N/C, the thickness of layer modified increases. Further, when N/C is more than 200, the amount of C decreases, resulting in dilution of reducing atmosphere, and the alumina substrate is hardly modified to aluminum nitride.

As explained above, a method according to which surface of an aluminum substrate can be modified to aluminum nitride at relatively low temperatures has been realized by exposing the surface of the alumina substrate to carbon vapor and simultaneously or intermittently irradiating the substrate with nitrogen ions. This means that bonding between Al and $O_2$ which constitute alumina is cut off by irradiation with nitrogen ions and this $O_2$ forms CO or $CO_2$ with carbon vapor and is evacuated and, on the other hand, Al from which $O_2$ has been cut off reacts with N of nitrogen ions to form AlN in the surface portion of the alumina substrate. In the above case, bonding between Al and $O_2$ which constitute alumina is cut off by irradiation with nitrogen ions, but the bonding can also be cut off by irradiation with accelerated particles such as laser beam, electron beam or inert gas. Also when bonding between Al and $O_2$ is cut off by such particles, AlN can be formed in the surface portion of alumina substrate by application of nitrogen ions to the alumina substrate.

The second example of the present invention will be explained referring to FIG. 7. This example shows an apparatus used for surface modification of alumina powders 17 in place of alumina substrate 1 referred to above.

Hopper 16 for leading alumina powders 17 to the position where they are treated was provided in vacuum vessel 10 and using hydrocarbon gas 18 for providing reducing atmosphere, the surface of alumina powders 17 was modified by irradiating the alumina powders with nitrogen ions 2 from ion source 5 while the alumina powders were dropped from hopper 16 in the reducing atmosphere of reduced pressure.

Figure 7:
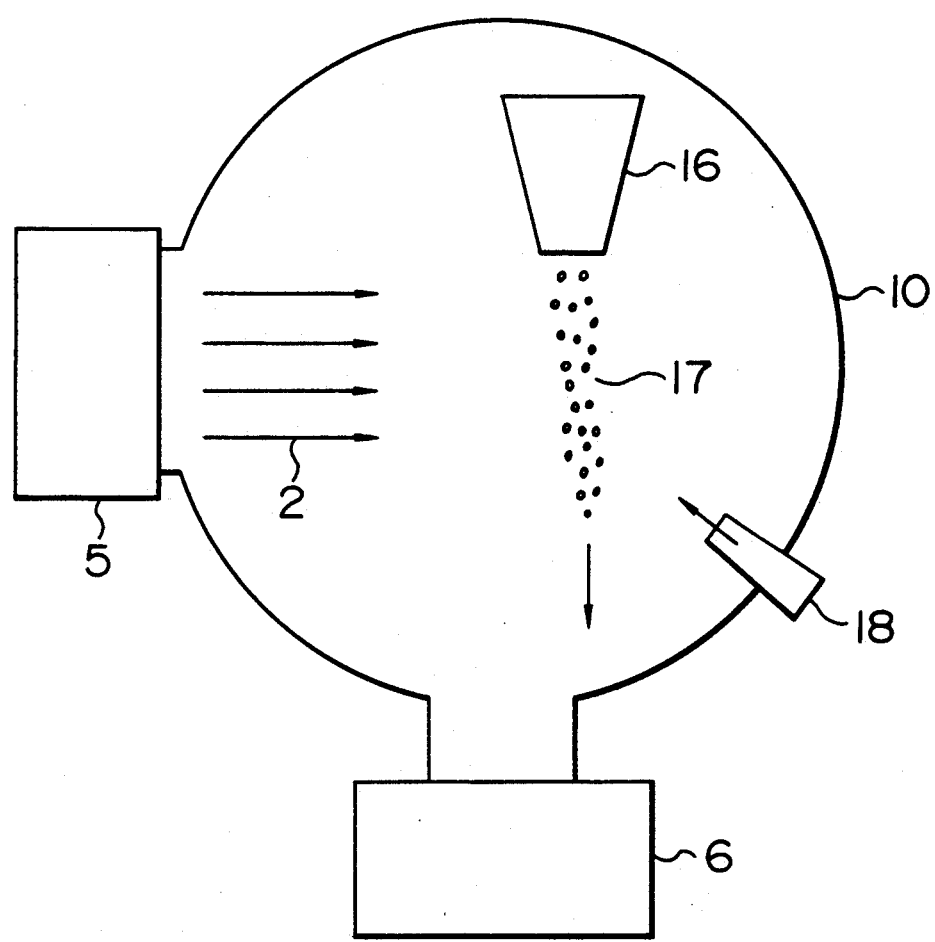
FIG. 7 schematically shows the second example of the surface modifying apparatus of the present invention.
Figure 8:
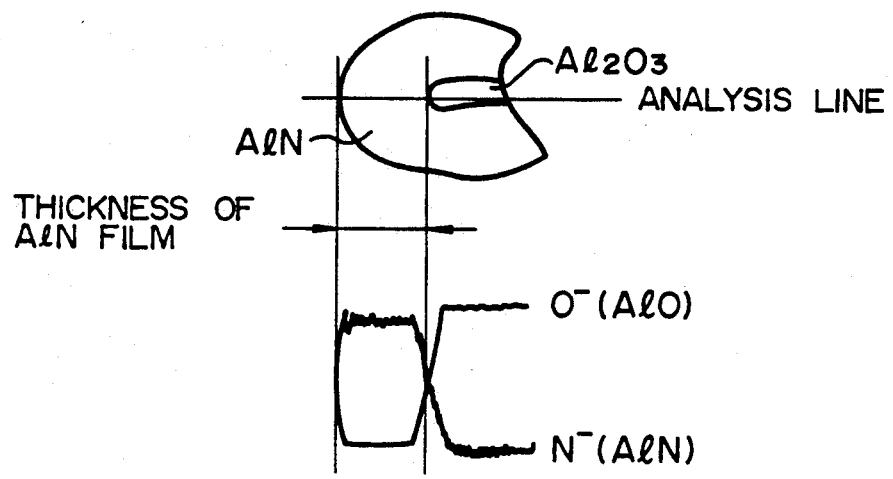
FIG. 8 shows the results of analysis by secondary ion-mass spectrography when surface of alumina powder was modified to aluminum nitride by the present invention.

FIG. 8 shows results of analysis by SIMS (secondary ion mass spectrometry) of alumina powders, the surface or the whole of which was modified to aluminum nitride according to the second example explained by FIG. 7 hereinabove. The results of this analysis which was conducted by line analysis of $N^-$(AlN) and $O^{--}$(AlO) in the direction of from left to right along analysis line for section of one $Al_2O_3$ powder shows that the surface layer portion was modified from $Al_2O_3$ to AlN.

The analyzed aluminum nitride was formed by surface modification carried out under the treating conditions of FIG. 4 (c) (carbon deposition rate 10 Å/s) explained before.

Figure 9:
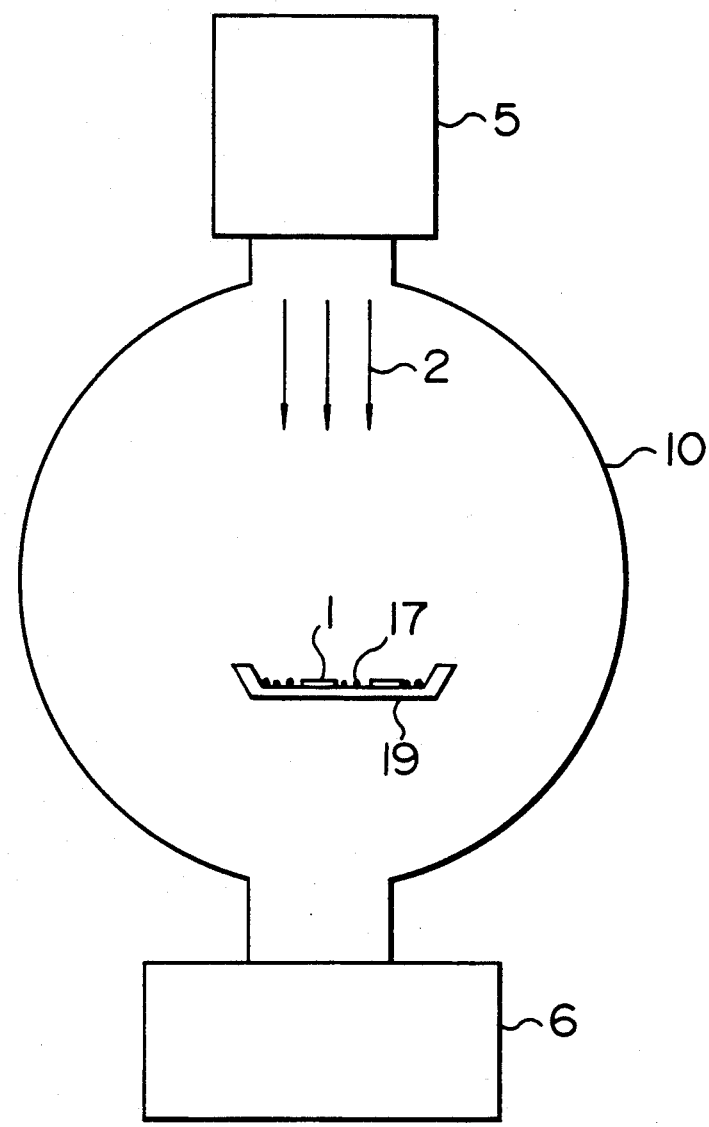

Next, the third example of the present invention will be explained referring to FIG. 9. In FIG. 9, chips of alumina substrate 1 or alumina powers 17 which were put on tray 19 made of a material containing carbon component were irradiated with nitrogen ions 2 from ion source 5 from above in vacuum vessel 10. Nitrogen ions 2 sputtered inner wall or bottom of tray 19 to generate radicals of carbon. Since alumina substrate 1 or alumina powders 17 in this atmosphere were irradiated with nitrogen ions 2, efficient modification to aluminum nitride becomes possible.

Figure 10:
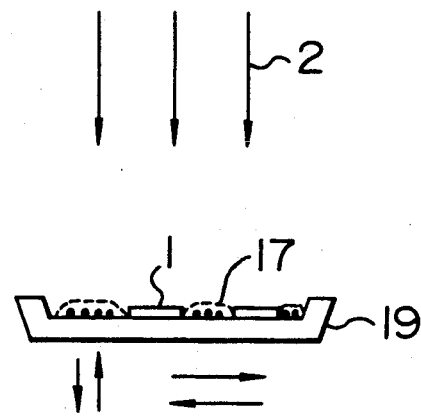
FIGS. 9, 10 and 11 schematically show the third, fourth and fifth examples of the surface modifying apparatus of the present invention.

The example shown in FIG. 10 has such a structure that the tray 19 explained regarding FIG. 9 can move upward and downward and left and right. This structure has such an effect that the alumina substrate or alumina powders can be equally and uniformly modified to aluminum nitride.

Figure 11:
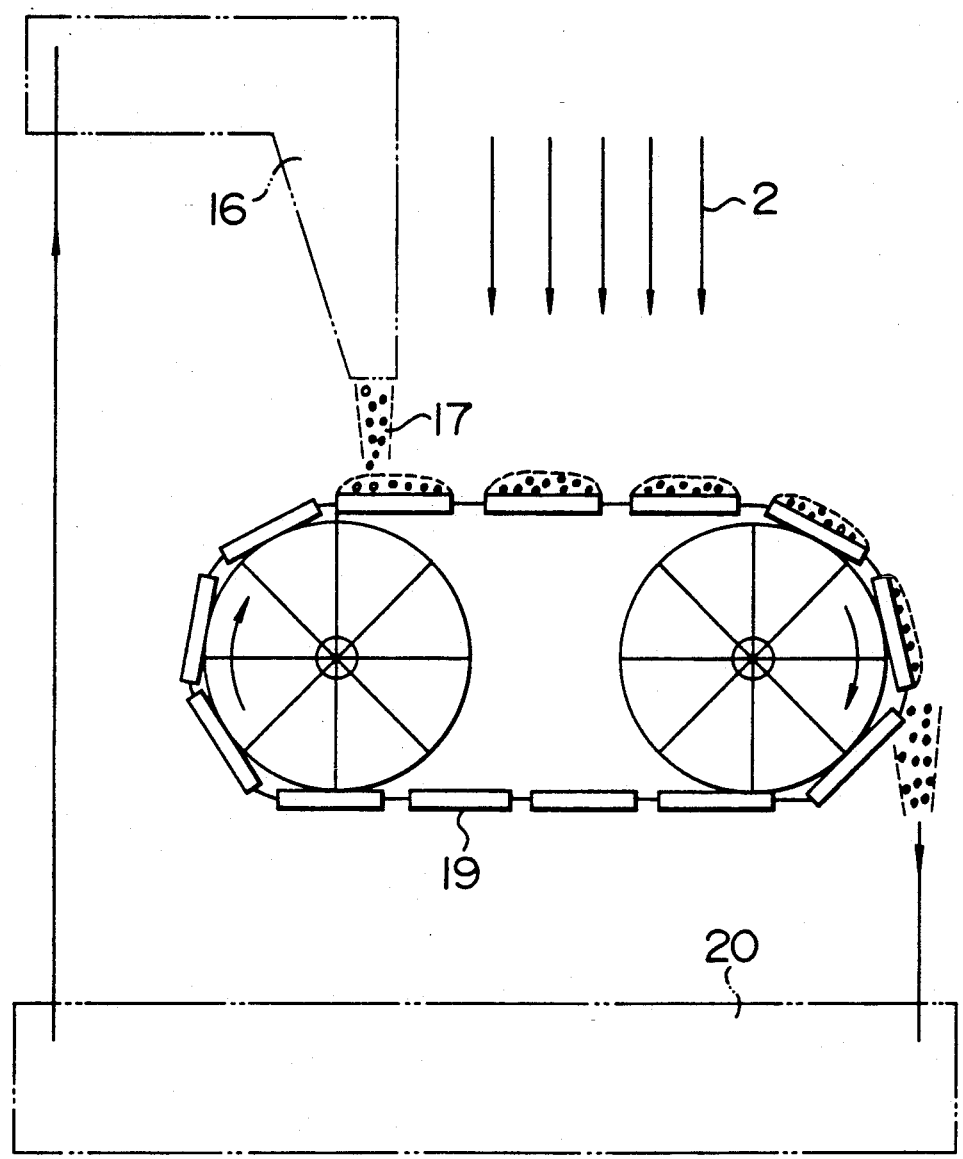

Furthermore, the fifth example of the present invention will be explained referring to FIG. 11. The apparatus for surface modification of this example has a conveying device for circulating alumina powders 17 put on endlessly connected trays 19 made of a material containing a carbon component, hopper 16 for leading alumina powders 17 onto trays 19, and transfer device 20 for feeding the modified alumina powders to hopper 16. According to this construction, alumina substrates or alumina powders can be continuously and repeatedly subjected to the treatment for surface modification to aluminum nitride as compared with the examples of FIGS. 9 and 10 and so, AlN powders of high quality can be easily produced in an industrial scale.

Alumina powders in the order of micron or submicron in size were wholly modified to aluminum nitride by the apparatus shown in FIG. 7 which is one of this example and an AlN plate was made therefrom by usual sintering method. Properties of this AlN plate were measured and the results are shown in Table 1 in comparison with the results on $Al_2O_3$ powder sintered body. From Table 1, it can be seen that AlN plate is superior in insulating characteristics and thermal conductivity characteristics.

TABLE 1

| | Comparision of properties | |
|---|---|---|
| | Material | |
| Properties | Sintered body of $Al_2O_3$ powder | Sintered body of AlN powder prepared by the present invention |
| Thermal conductivity W/m K (at R.T.) | 20 | 170-200 |
| Dielectric constant $\epsilon$ (at R.T.) | 8.5 | 7-8 |
| Dielectric loss tan $\delta \times 10^{-4}$ (at 1 MHz) | 3 | 4 |
| Electric resistance $\Omega$ - cm (at R.T.) | $10^{14}<$ | $10^{14}<$ |
| Dielectric strength kV/cm (at R.T.) | 100 | 200-220 |

That is, the aluminum nitride obtained in the present invention is similar to alumina in electric resistance, but is larger in dielectric strength and thermal conductivity and so has uses as an insulating sheet and a high heat sink for electronic parts. It can be further applied to heat sinks for power transistors and laser diodes, insulation heat sinks of thyristors, circuit substrates for power transistor modules, and packages for IC3 s and LSI's.

Figure 12:
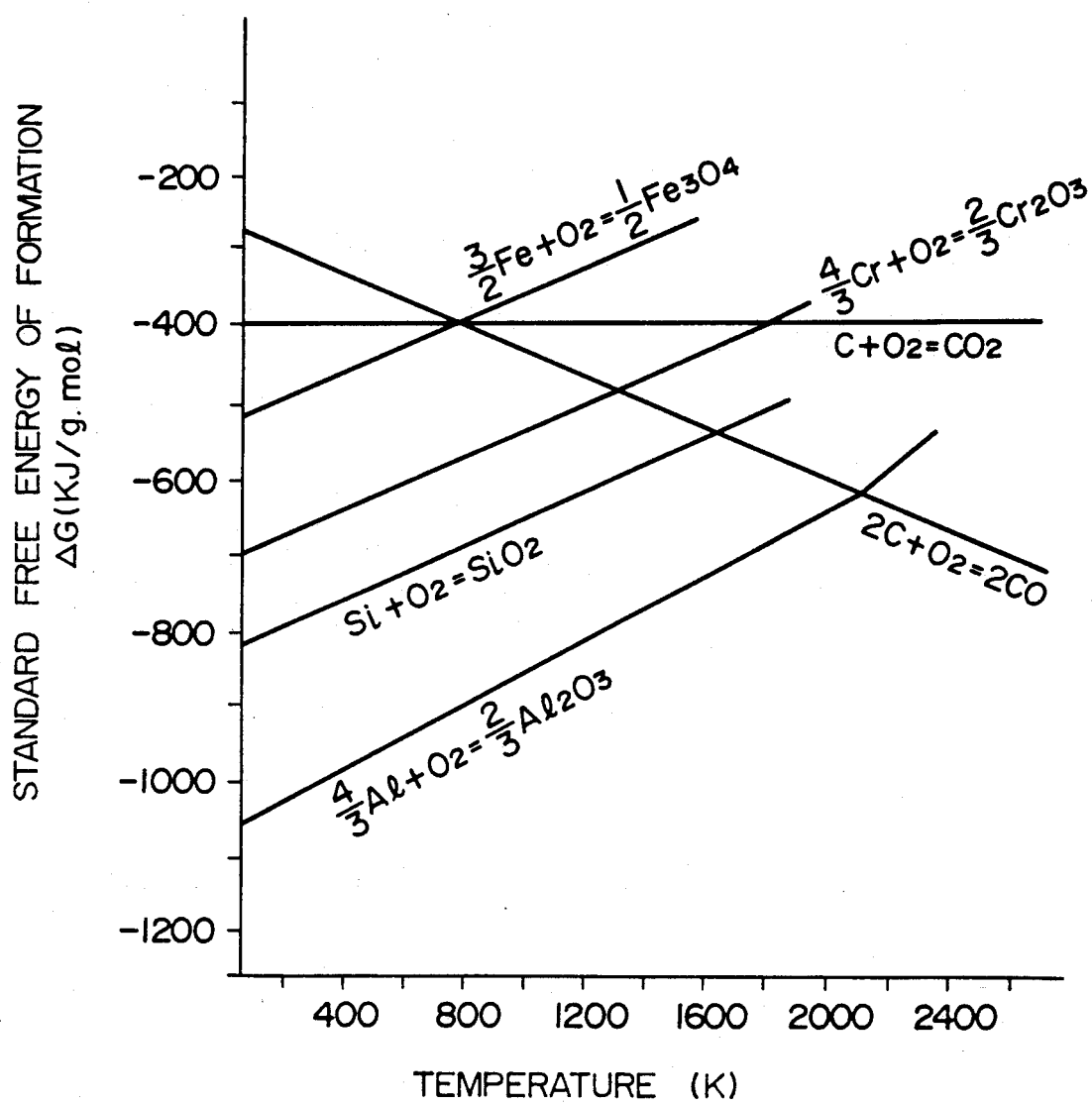
FIG. 12 is a graph which shows standard free energy for production of oxide in relation to temperature.

In the above examples of the present invention, alumina was used. However, alumina ($Al_2O_3$) is a very stable oxide small in standard free energy $\Delta G$ for formation of oxide as shown in FIG. 12 and the fact that such alumina can be modified as explained above shows that oxides larger than alumina in $\Delta G$ can be more easily subjected to reactions such as reduction than alumina.

Therefore, the substrate of the present invention includes not only the above-mentioned alumina ($Al_2O_3$), but also oxides, sulfides and carbides of metals. Examples thereof are silica ($SiO_2$) and iron oxides (such as $Fe_2O_3$ and $Fe_3O_4$) in the form of plate or powder.

Silicon nitride ($Si_3N_4$) prepared by modification of silica ($SiO_2$) is low in thermal expansion coefficient and high in electrical insulation and mechanical strength and so can provide highly heat resistant materials.

Iron nitrides (such as $Fe_4N$ and $Fe_{16}N_2$) prepared by modification of iron oxides (such as $Fe_2O_3$ and $Fe_3O_4$) are excellent in magnetic characteristics such as high saturated magnetic flux density and utilization thereof for magnetic discs and magnetic heads has been studied.

Further, in the above examples of the present invention, carbon was evaporated from an evaporation source or hydrocarbon gas was injected, but it is clear that electron beam evaporation, ion beam evaporation, magnetron sputtering, resistance heating evaporation and the like can be employed in addition to the evaporation by the vacuum evaporation method.

In the above examples of the present invention, carbon evaporation source or trays made of materials containing a carbon component was used for providing a reducing atmosphere, but a sulfur evaporation source or trays made of materials containing a sulfur component can be also used for the same purpose.

Furthermore, it is also possible by using the same method and apparatus as of the present invention to convert the surface of a substrate of metal nitride, sulfide or carbide to a metal oxide by providing a reducing atmosphere and irradiating the substrate with accelerated oxygen ions.

As explained above, the first invention can effectively provide a method for efficient modification of surface of substrate at relatively low temperatures and an apparatus used therefor.

The second invention can effectively provide a method for efficient modification of surface of alumina substrate and alumina powder at relatively low temperatures and an apparatus used therefor.

What is claimed is:

1. A method for surface modification which comprises placing in a vacuum vessel a substrate having a surface made of a first compound comprising a metal element and a nonmetal element, providing over the substrate an atmosphere capable of reacting with the nonmetal element, thereby forming a gaseous product and simultaneously therewith irradiating the substrate with accelerated ions reactable with the metal element, thereby forming on the surface of the substrate a second compound comprising the metal element and the irradiated ions.

2. A method according to claim 1, wherein the surface of the substrate is made of an oxide, a sulfide or a carbide of said metal element, and the accelerated ions are nitrogen ions.

3. A method according to claim 1, wherein the surface of the substrate is made of a nitride, a sulfide or a carbide of said metal element, and the accelerated ions are oxygen ions.

4. A method for surface modification which comprises placing in a vacuum vessel a substrate having a surface made of an oxide of metal, providing a reducing atmosphere over the substrate, irradiating the substrate with accelerated ions thereby freeing oxygen from the metal on the surface of the substrate, allowing the free oxygen to react with a constituent of said reducing atmosphere thereby forming a gaseous product, evacuating the gaseous product and allowing the metal of the surface of the substrate to react with the accelerated ions, thereby forming a compound of the metal and the ions on the surface of the substrate.

5. A method for surface modification which comprises placing in a vacuum vessel a substrate having a surface made of an oxide of metal, providing a reducing atmosphere over the substrate and simultaneously therewith irradiating the substrate with accelerated particles, thereby freeing oxygen form the metal on the surface of the substrate, allowing the free oxygen to react with a constituent of the reducing atmosphere thereby forming a gaseous product, evacuating the gaseous product and irradiating the surface of the substrate with accelerated ions to react the ions with the metal of the surface of the substrate, thereby forming a compound of the metal and the ions on the surface of the substrate.

6. A method for surface modification which comprises placing an alumina substrate in a vacuum vessel and providing carbon vapor over the alumina substrate by vacuum evaporation and simultaneously therewith irradiating the alumina substrate with accelerated nitrogen ions form an ion source, thereby forming aluminum nitride on the surface of the alumina substrate.

7. A method for surface modification which comprises placing an alumina substrate in a vacuum vessel, irradiating the alumina substrate with accelerated nitrogen ions from an ion source, thereby cleaning the surface of the alumina substrate and providing carbon vapor over the alumina substrate by vacuum evaporation and simultaneously therewith irradiating the cleaned surface of the alumina substrate with accelerated nitrogen ions form the ion source, thereby forming aluminum nitride on the surface of the alumina substrate.

8. A method for surface modification which comprises providing a hydrocarbon gas over alumina powder placed at a treatment position in a vacuum vessel and simultaneously therewith irradiating the alumina powder with accelerated nitrogen ions form an ion source, thereby forming aluminum nitride on the surface of the alumina powder.

* * * * *